(12) United States Patent
Hsiao et al.

(10) Patent No.: US 8,943,454 B1
(45) Date of Patent: Jan. 27, 2015

(54) IN-PHASE GROUPING FOR VOLTAGE-DEPENDENT DESIGN RULE

(71) Applicant: Taiwan Semiconductor Manufacturing Company Ltd., Hsinchu (TW)

(72) Inventors: Chih Chi Hsiao, Kaohsiung (TW); Jill Liu, Hsinchu County (TW); Wei-Yi Hu, Hsinchu County (TW); Jui-Feng Kuan, Hsinchu County (TW); Yu-Ren Chen, Hsinchu County (TW); Kuo-Ji Chen, Taipei County (TW); Jian-Yi Li, Hsinchu (TW); Wen-Ju Yang, Hsinchu (TW)

(73) Assignee: Taiwan Semiconductor Manufacturing Company Ltd., Hsinchu (TW)

( * ) Notice: Subject to any disclaimer, the term of this patent is extended or adjusted under 35 U.S.C. 154(b) by 0 days.

(21) Appl. No.: 14/072,171

(22) Filed: Nov. 5, 2013

(51) Int. Cl.
*G06F 17/50* (2006.01)

(52) U.S. Cl.
CPC .................................. *G06F 17/5081* (2013.01)
USPC .......................................... 716/113; 716/139

(58) Field of Classification Search
CPC ................................ G06F 17/50; G06F 9/455

USPC .................................................. 716/113, 139
See application file for complete search history.

(56) References Cited

U.S. PATENT DOCUMENTS 7,994,465 B1 * 8/2011 Bamji et al. .............. 250/214 R

OTHER PUBLICATIONS

Hsiao, Chih Chi. U.S. Appl. No. 13/539,258 (not yet published), filed Jun. 29, 2012.

\* cited by examiner

*Primary Examiner* — Thuan Do
(74) *Attorney, Agent, or Firm* — WPAT, P.C.; Anthony King (57) ABSTRACT

In some embodiments, in a method for considering in-phase grouping for a voltage-dependent design rule, for a first net and a second net in a schematic, first data for obtaining the differences between first voltage values of the first and second nets, and between second voltage values of the first and second nets is provided. For each of the first and second nets, the first voltage value is larger than the second voltage value. A layout for the schematic is generated. In the layout, a relationship of a first shape and a second shape associated with the first and the second nets, respectively, is defined using the first data.

18 Claims, 11 Drawing Sheets

IN-PHASE GROUPING FOR VOLTAGE-DEPENDENT DESIGN RULE

BACKGROUND

As process nodes advance, voltage-dependent design rules are considered in designing integrated circuits (IC) as some of the safe guards for proper functions and/or performance in continuously miniaturized designs. In some approaches, the voltage-dependent design rules include a spacing between shapes in a layout associated with nets of a design determined based on the maximum voltage difference between simulation results of the nets.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAIL DESCRIPTION

Embodiments, or examples, of the disclosure illustrated in the drawings are now described using specific languages. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numbers may be repeated throughout the embodiments, but this does not necessarily require that feature(s) of one embodiment apply to another embodiment, even if they share the same reference number. It will be understood that when an element is referred to as being "connected to" or "coupled to" another element, it may be directly connected to or coupled to the other element, or intervening elements may be present.

Some embodiments have one or a combination of the following features and/or advantages. In some embodiments, for design rule checking, a layout of a design is modified to indicate voltage data and in-phase data which characterize magnitude and phase of voltages associated with polygons in the layout, respectively. In other embodiments, based on voltage-dependent design rules, a layout of a design is generated using the voltage data and in-phase data. For out-of-phase polygons, the voltage-dependent design rule involves performing cross-comparisons on the voltages associated with the polygons, and for in-phase polygons, the voltage-dependent design rule involves performing corresponding-comparisons on the voltages associated with the polygons. Therefore, spacing for in-phase polygons are decreased, and area of the design is reduced without compromising yields of the design.

Figure 1:
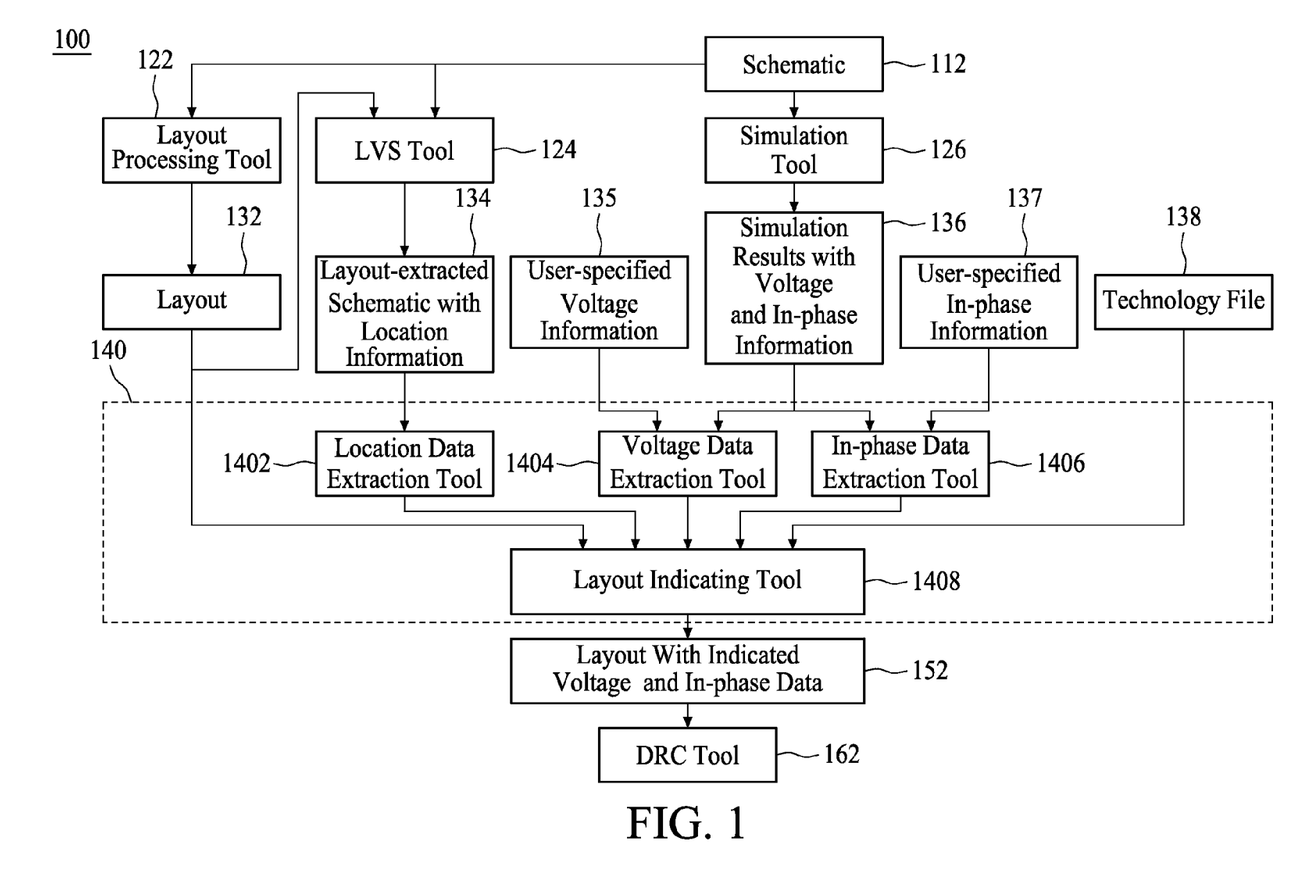
FIG. 1 is a block diagram of a semiconductor device design system in accordance with some embodiments.

FIG. 1 is a block diagram of a semiconductor device design system 100 in accordance with some embodiments. The system 100 is configured to generate a layout with indicated voltage and in-phase data 152 for design rule check (DRC) to be performed thereon. The system 100 includes a layout processing tool 122, a layout versus schematic (LVS) tool 124, a simulation tool 126, a voltage-dependent layout processing tool 140 and a DRC tool 162. The layout processing tool 122 is configured to receive a schematic 112 of the semiconductor device and generate a layout 132. The LVS tool 124 is configured to receive the schematic 112 and the layout 132, and generate a layout-extracted schematic with location information 134. The simulation tool 126 is configured to receive the schematic 112 and provide simulation results with voltage and in-phase information 136. The voltage-dependent layout processing tool 140 is configured to receive the layout 132, the layout-extracted schematic with location information 134, the simulation results with voltage and in-phase information 136 and/or user-specified voltage information 135 and user-specified in-phase information 137, and a technology file 138, and generate the layout with indicated voltage and in-phase data 152. The voltage-dependent layout processing tool 140 includes a location data extraction tool 1402, a voltage data extraction tool 1404 and an in-phase data extraction tool 1406. The location data extraction tool is configured to extract location data from the layout-extracted schematic with location information 134. The voltage data extraction tool is configured to receive the simulation results with voltage and in-phase information 136 and/or user-specified voltage information 135, and generate voltage data reflecting magnitude characteristics of the simulation results. The in-phase data extraction tool 1406 is configured to receive the simulation results with voltage and in-phase information 136 and/or user-specified in-phase information 137, and generate in-phase data reflecting phase characteristics of the simulation results. The layout indicating tool 1408 is configured to receive the layout 132, the location data, the voltage data, the in-phase data, and a technology file 138 with technology-specific information, and create voltage indicators and in-phase indicators at particular locations in the layout 132 to generate a layout with indicated voltage and in-phase data 152. The DRC tool 162 is configured to perform voltage-dependent DRC verification on the layout with indicated voltage and in-phase data 152.

Figure 2:
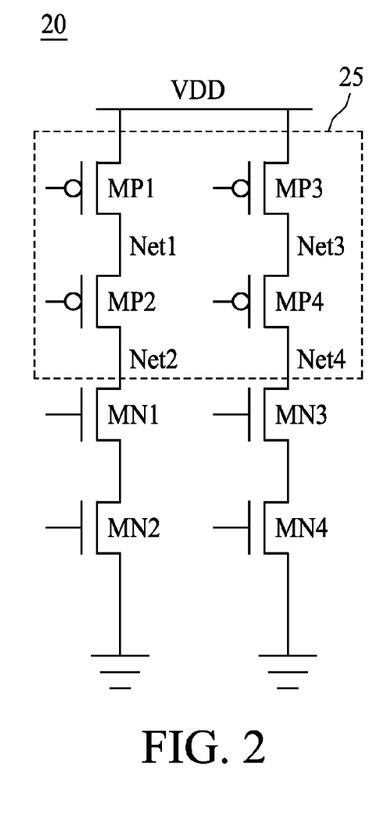
FIG. 2 is a diagram of a partial schematic of the schematic in FIG. 1 in accordance with some embodiments.

FIG. 2 is a diagram of a partial schematic 20 of the schematic 112 in FIG. 1 in accordance with some embodiments. The partial schematic 20 includes in a first path from a supply rail VDD to a ground, p-channel metal oxide semiconductor field effect transistors (PMOSs) MP1 and MP2 and n-channel metal oxide semiconductor field effect transistors (NMOSs) MN1 and MN2, and in a second path from the supply rail VDD to the ground, PMOSs MP3 and MP4 and NMOSs MN3 and MN4. A PMOS section 25 in the partial schematic 20 is used as an example below. Nets at drains of the PMOS MP1 to MP4 are labeled as Net1 to Net4, respectively.

The partial schematic 20 is exemplary. Semiconductor devices including other circuit topologies and/or including other types of active circuit elements such as diodes, bipolar junction transistors (BJT), non-planar FETs, high voltage transistors and high frequency transistors, and passive circuit elements such as capacitors, inductors and resistors are within the contemplated scope of the present disclosure. In addition, the term "schematic" used in the present disclosure is not limited to graphical representations of circuits and includes also textual representations of the circuits. The term "schematic" is interchangeable with the term "netlist" known in the field.

Figure 3:
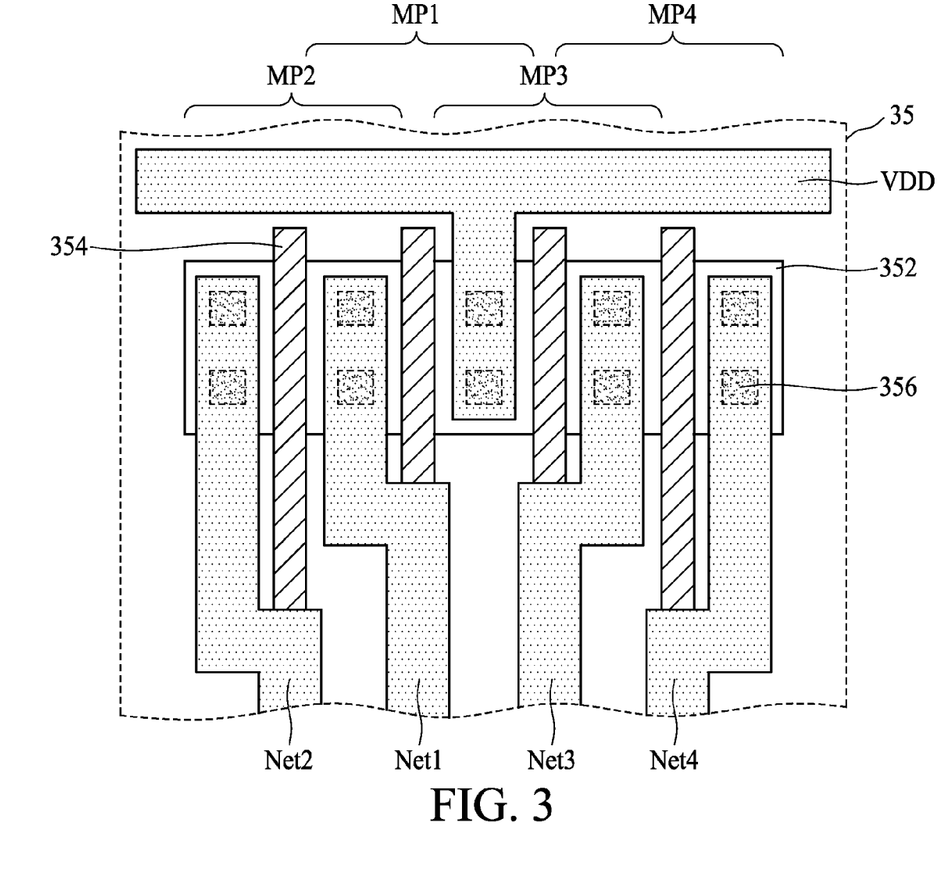
FIG. 3 is a diagram of a partial layout of the layout in FIG. 1 in accordance with some embodiments.

The layout processor 122 in FIG. 1 is configured to generate the layout 122 based on the schematic 112. In some embodiments, the layout 132 generated by the layout processing tool 122 includes a layout database upon which modifying operations can be performed. In other embodiments, the layout 132 includes a layout file which can be used to render the layout database. FIG. 3 is a diagram of a partial layout 35 of the layout 132 in accordance with some embodiments. The partial layout 35 corresponds to the PMOS section 25 in the partial schematic 20. The partial layout 35 includes polygons 352 in an oxide diffusion (OD) layer for sources or drains of the PMOSs MP1, MP2, MP3 and MP4; polygons 354 in a polysilicon layer for gates of the PMOSs MP1, MP2, MP3, and MP4; a polygon VDD and polygons Net1, Net2, Net3 and Net4 in a metallization layer and polygons 356 in a via layer for the nets VDD, Net1, Net2, Net3, and Net4. In the partial layout 35, the PMOSs MP2 and MP1 are adjacent, the PMOSs MP3 and MP4 are adjacent, and the PMOSs MP1 and MP3 are adjacent. The polygons Net1 and Net2 corresponding to the first path from the supply rail VDD to the ground in FIG. 2 are adjacent. The polygons Net3 and Net4 corresponding to the second path from the supply rail VDD to the ground are adjacent. The polygons Net1 and Net3 corresponding to the first path and the second path from the supply rail VDD to the ground, respectively. The adjacent polygons Net2 and Net1, adjacent polygons Net3 and Net4, and the adjacent polygons Net1 and Net3 are subject to voltage-dependent design rules.

The partial layout 35 is exemplary. In some embodiments, a schematic includes circuit blocks each of which includes a plurality of circuit elements which are electrically connected together by a plurality of nets, and includes a plurality of nets interconnecting the circuit blocks. Corresponding to the circuit elements and the nets in each circuit block, and the nets interconnecting the circuit blocks, polygons in different layers are created in a layout. In some embodiments, the polygons within the same layer are subject to the voltage-dependent design rules. In some embodiments, the polygons within adjacent layers are also subject to the voltage dependent design rules. Voltages associated with the polygons are based on those of the nets that the polygons are associated with. For example, voltages for the polygon 352 in the OD layer for the drain of the PMOS MP1, the polygon Net1 in the metallization layer, and the polygon 356 in the via layer coupled between the polygon 352 and the polygon Net1 are based on the voltage of the net Net1 in FIG. 2. In some embodiments, the polygons in the same circuit block as the polygon subject to the voltage dependent design rules are correspondingly adjusted. Shapes other than polygons, such as those with curved peripheries are within the contemplated scope of the present disclosure.

The LVS tool 124 in FIG. 1 is configured to generate the layout-extracted schematic with location information 134 based on the layout 132 and the schematic 112. In the layout-extracted schematic with location information 134, physical locations of the polygons, the polygon Net1 for example, in the layout 132 are associated to nets, the net Net1 for example, in the schematic 112. Then, the locations data are extracted by the location data extraction tool 1402 from the layout-extracted schematic with location information 134. In some embodiments, the location data of a net, the net Net1 in FIG. 2 for example, includes a net identifier such as "Net1", and coordinates $(X_1, Y_1, Z_1)$, wherein the X and Y coordinates correspond to a location of a vertex of a polygon, the polygon Net1 in FIG. 3 for example, and the Z coordinate corresponds to the layer of the polygon Net1. Other approaches for identifying a physical location of a polygon associated with a net are within the contemplated scope of the present disclosure.

Figure 4:
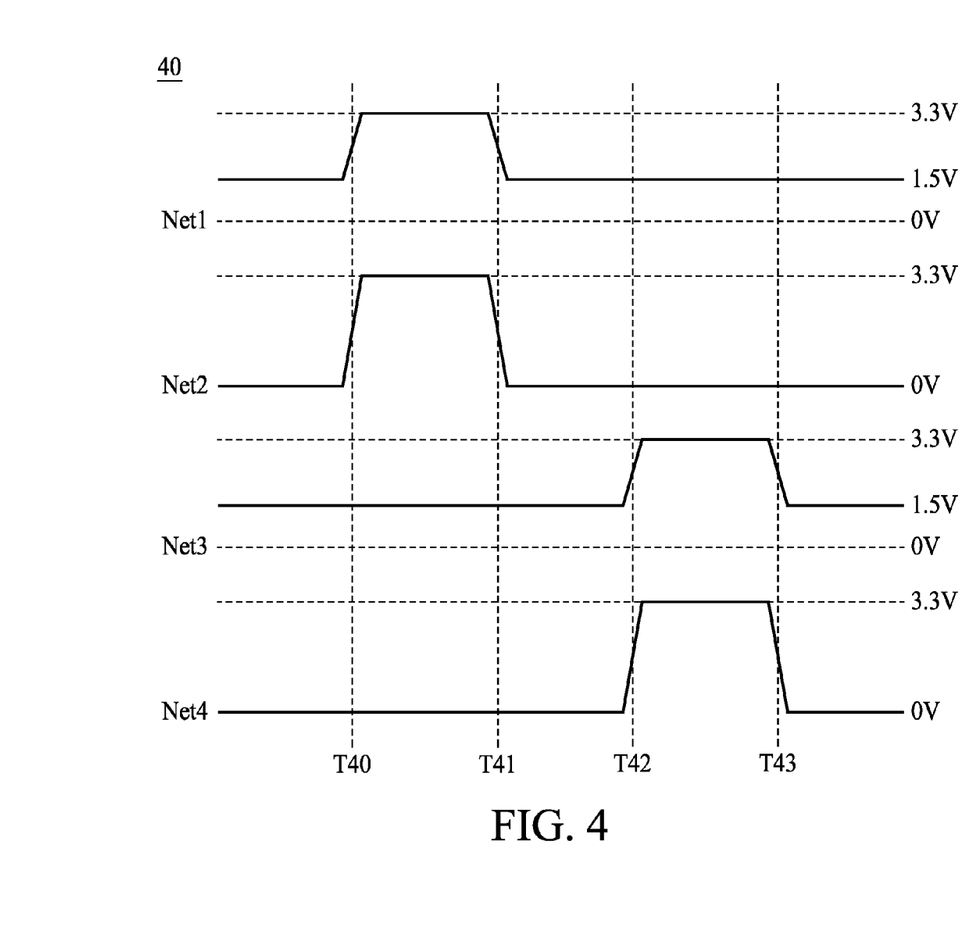
FIG. 4 is a timing diagram of exemplary voltage waveforms of the simulation results with voltage and in-phase information in FIG. 1 in accordance with some embodiments.

The simulation tool 126 in FIG. 1 is configured to produce the simulation results with voltage and in-phase information 136 of the schematic 112. FIG. 4 is a timing diagram 40 of exemplary voltage waveforms of the simulation results with voltage and in-phase information 136 in accordance with some embodiments. In the timing diagram 40, at time T40, a voltage of the net Net1 begins rising from 1.5V to 3.3V, and correspondingly a voltage of the net Net2 begins rising from 0 V to 3.3V. At time T41, the voltage of the net Net1 begins falling from 3.3V to 1.5V, and correspondingly the voltage of the net Net2 begins falling from 3.3V to 0V. At time T42, a voltage of the net Net3 begins rising from 1.5V to 3.3V, and correspondingly a voltage of the net Net4 begins rising from 0 V to 3.3V. At time T43, the voltage of the net Net3 begins falling from 3.3V to 1.5V, and correspondingly the voltage of the net Net4 begins falling from 3.3V to 0V.

The voltage data extraction tool 1404 is configured to extract the voltage data from the simulation results 136 and/or the user-specified voltage information 135. In some embodiments, the voltage data of the net Net1 or Net2 includes a net identifier such as "Net 1" or "Net2", and voltage values characterizing the voltage waveform of the simulation result 136 of the net Net1 or Net2. In some embodiments, the voltage values characterizing the voltage waveform of the net Net1 or Net2 are the minimum voltage value 1.5V or 0V and the maximum voltage value 3.3V or 3.3V in the voltage waveform.

The in-phase data extraction tool 1406 is configured to extract the in-phase data from the simulation results 136 and/or the user-specified in-phase information 137. In some embodiments, the in-phase data of the nets Net1 and Net2 reflects that the voltage waveforms of the nets Net1 and Net2 are in-phase. In some embodiments, the in-phase data of the nets Net1 and Net2 is an entry in a list of groups of nets that are in-phase. The voltage waveforms of the nets Net1 and Net2 are determined in-phase because the rising transitions of the nets Net1 and Net2 occur correspondingly, and the falling transitions of the nets Net1 and Net2 occur correspondingly. In some embodiments, the transitions of the nets Net1 and Net2 are determined to occur correspondingly if one transition occurs within a predetermined delay from the other transition. For in-phase voltage waveforms, voltage values characterizing the voltage waveforms occur correspondingly and are therefore correspondingly compared for a voltage-dependent design rule. For example, the minimum voltage values in the voltage waveforms of the nets Net1 and Net2, which are 1.5V and 0V, respectively, are correspondingly compared, and the maximum voltage values in the voltage waveforms of the nets Net1 and Net2, which are both 3.3V, are correspondingly compared.

Voltage data and in-phase data are also extracted from the simulation results 136 of the nets Net3 and Net4. The voltage waveform of the nets Net3 and Net4 also have the minimum voltage values of 1.5V and 0V, respectively, and the maximum voltage value of 3.3V and 3.3V, respectively, and are also in-phase. Therefore, the voltage data and the in-phase data extracted for the nets Net3 and Net4 are similar to those of the nets Net1 and Net2.

The voltage waveforms of the nets Net1 and Net3 which are also adjacent in FIG. 3, however, do not occur correspondingly and are therefore out-of-phase. In some embodiments, the in-phase data extraction tool 1406, does not create in-phase data for the nets Net1 and Net3 to reflect that the voltage waveforms of the nets Net1 and Net3 are out-of-phase. For out-of-phase waveforms, voltage values characterizing the voltage waveforms, do not correspond to each other and are therefore cross-compared for a voltage-dependent design rule. For example, the maximum voltage value of the net Net1 which is 3.3V is cross-compared with the minimum voltage value of the net Net3 which is 1.5V, and the minimum voltage value of the net Net1 which is 1.5V is cross-compared with the maximum voltage value of the net Net3 which is 3.3V.

Other ways to reflect that the nets are in-phase or out-of-phase such as recording nets which are out-of-phase, or recording both nets which are in-phase and out-of-phase are within the contemplated scope of the present disclosure.

Figure 5A:
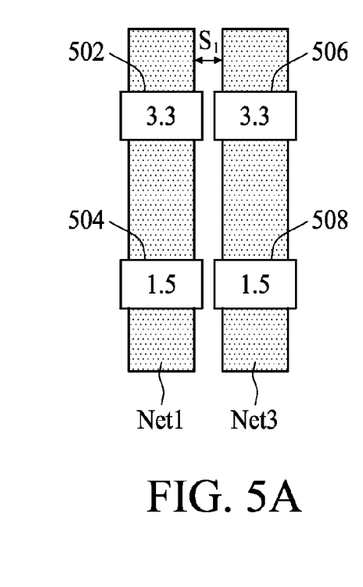
FIG. 5A is a diagram of some out-of-phase nets in the layout in FIG. 1 employing marker shapes as indicators in accordance with some embodiments.

The layout indicating tool 1408 is configured to modify the layout 132 using the location data, the voltage data, the in-phase data and the technology file 138 received to generate the layout with indicated voltage and in-phase data 152. In some embodiments, the technology file 138 contains information for transforming the voltage data into voltage indicators and in-phase data into in-phase indicators. FIG. 5A is a diagram of some out-of-phase nets in the layout 152 employing marker shapes as indicators in accordance with some embodiments. In some embodiments, based on the voltage data and the unfound in-phase data of the nets Net1 and Net3, maker shapes 502, 504 are created as voltage indicators for the polygon Net1, marker shapes 506 and 508 are created as voltage indicators for the polygon Net3, and no in-phase indicator is created. In some embodiments, the marker shape 502 includes the maximum voltage value of the net Net1 and the marker shape 504 includes the minimum voltage value of the net Net1. The marker shape 506 includes the maximum voltage value of the net Net3 and the marker shape 508 includes the minimum voltage value of the net Net3. In some embodiments, the marker shape 502, 504, 506, or 508 is in the same layer as the polygon Net1 or Net3 so that the DRC tool 162 recognizes the marker shape 502, 504, 506, or 508 as being associated with the polygon Net1 or Net3. Data types recognized by the DRC tool 162 are different for the polygon Net1 or Net3 and the marker shape 502, 504, 506, or 508. In other embodiments, the marker shape 502, 504, 506, or 508 are created using a layer different from but associated with that of the polygon Net1 or Net3. The marker shapes 502, 504, 506 and 508 shown in FIG. 5A are exemplary. Shapes other than rectangles are within the contemplated scope of the present disclosure.

The DRC tool 162 is configured to receive the layout 152 and perform design rule checking on the layout 162. Because the polygons Net1 and Net3 do not have any in-phase indicator attached thereto, the DRC tool 162 applies the voltage-dependent design rule that involves cross-comparisons on the voltage indicators of the polygons. In some embodiment, the voltage-dependent design rule is provided to the DRC tool 162 in a script for the DRC tool 162. In some embodiments, the voltage-dependent design rule for output-of-phase nets determines a spacing $S_1$ of the polygons Net1 and Net3 based on an out-of-phase voltage difference calculated using equation (1).

$$\Delta V_{out\text{-}of\text{-}phase} = \max(|V_{max1} - V_{min2}|, |V_{max2} - V_{min1}|) \qquad (1)$$

where $\Delta V_{out\text{-}of\text{-}phase}$ is the out-of-phase voltage difference; $V_{max1}$ and $V_{min1}$ are the maximum voltage value and the minimum voltage value of one of the polygons such as Net1, respectively; and $V_{max2}$ and $V_{min2}$ are the maximum voltage value and the minimum voltage value of the other of the polygons such as Net3, respectively. In the example in FIG. 5A, $V_{max1}$ and $V_{min1}$ of the polygon Net1 are equal to 3.3V and 1.5V, respectively, and $V_{max2}$ and $V_{min2}$ of the polygon Net3 are equal to 3.3V and 1.5V, respectively. Therefore, $\Delta V_{out\text{-}of\text{-}phase}$ used for determine the spacing $S_1$ between the nets Net1 and Net3 is 1.8V.

Figure 5B:
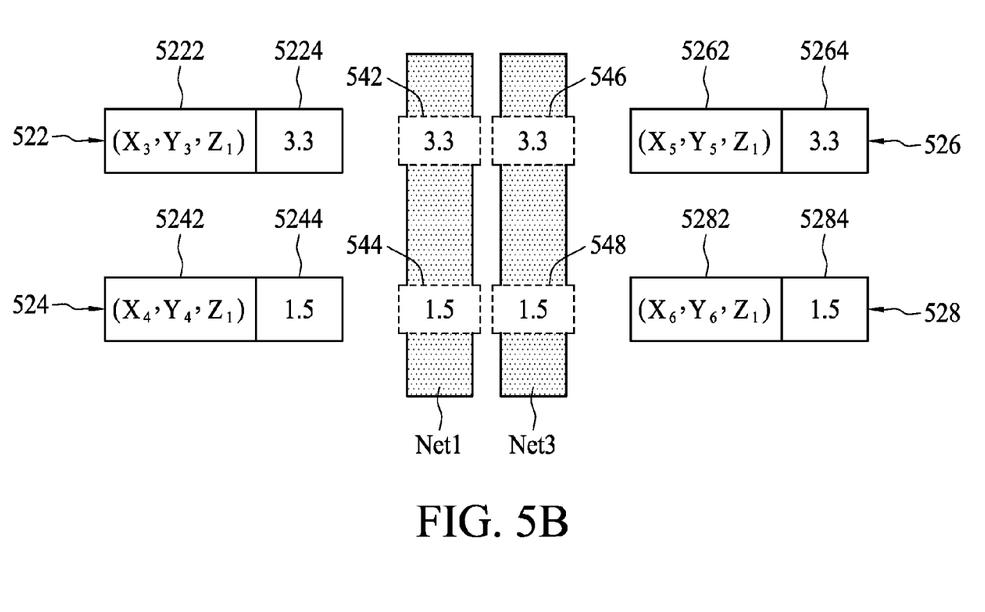
FIG. 5B is a diagram of some out-of-phase nets in the layout in FIG. 1 employing text labels as indicators in accordance with some embodiments.

FIG. 5B is a diagram of some out-of-phase nets in the layout 152 in FIG. 1 employing text labels as indicators in accordance with some embodiments. The embodiments described with reference to FIG. 5B are different from those described with reference to FIG. 5A in that the voltage indicators are implemented using text labels 522, 524, 526 and 528. In some embodiments, the text label 522, 524, 526 or 528 includes a location part 5222, 5242, 5262 or 5282 and a data part 5224, 5244, 5264 or 5284. The location part 5222, 5242, 5262 or 5282 includes coordinates $(X_3, Y_3, Z_1)$, $(X_4, Y_4, Z_1)$, $(X_5, Y_5, Z_1)$ or $(X_6, Y_6, Z_1)$ which reflect that the text label 522, 524, 526, or 528 is created at a location of a marker shape 542, 544, 546, or 548. The marker shapes 542, 544, 546, and 548 are shown for illustration purpose and are not part of the text labels 522, 524, 526 and 528. The data part 5224 and 5244 include the maximum voltage value and the minimum voltage value of the net Net1, respectively, and the data part 5264 and 5284 include the maximum voltage value and the minimum voltage value of the net Net3, respectively. In some embodiments, the coordinates $(X_3, Y_3, Z_1)$ and $(X_4, Y_4, Z_1)$ are determined based on the coordinates $(X_1, Y_1, Z_1)$ in the location data of the polygon Net1, and the coordinates $(X_5, Y_5, Z_1)$ and $(X_6, Y_6, Z_1)$ are determined based on coordinates $(X_2, Y_2, Z_1)$ in the location data of the polygon Net3. In some embodiments, the text labels 522 and 524, or 526 and 528 are in the same layer as the polygon Net1 or Net3 so that the DRC tool 162 recognizes the text label 522 and 524, or 526 and 528 as being associated with the polygon Net1 or Net3. Data types recognized by the DRC tool 162 are different for the polygon Net1 or Net3 and the text labels 522 and 524, or 526 and 528. In other embodiments, the text labels 522 and 524, or 526 and 528 are created using a layer different from but associated with that of the polygon Net1 or Net3. The manner with which the spacing between the polygons Net1 and Net3 are determined is similar to that described with reference to FIG. 5A and is therefore omitted here.

Figure 6A:
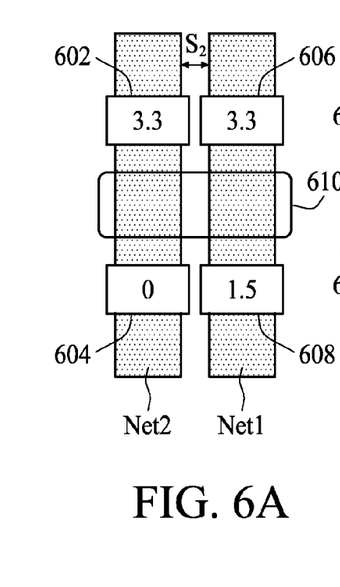
FIG. 6A is a diagram of some in-phase nets in the layout in FIG. 1 employing marker shapes as indicators in accordance with some embodiments.

FIG. 6A is a diagram of some in-phase nets in the layout 152 employing marker shapes as indicators in accordance with some embodiments. In some embodiments, for in-phase nets, in addition to marker shapes 602 and 604 created as voltage indicators for the polygon Net2, and marker shapes 606 and 608 created as voltage indicators for the polygon Net1, a maker shape 610 is created as a group indicator for the polygons Net2 and Net1. The voltage indicators are similar to those described with reference to FIG. 5A. The marker shape 602 includes the maximum voltage value for the net Net2, and the marker shape 604 includes the minimum voltage value of the net Net2. The marker shape 606 includes the maximum voltage value of the net Net1 and the marker shape 608 includes the minimum voltage of the net Net1. The group indicator is implemented by the marker shape 610 overlapping with the polygons Net1 and Net2. The marker shape 610 shown in FIG. 6A is exemplary. Shapes other than rounded rectangles and shapes that overlaps with a portion of each polygon that does not span a full width of the polygon are within the contemplated scope of the present disclosure. In some embodiments, the marker shape 610 is in the same layer as the polygon Net1 or Net2 so that the DRC tool 162 recognizes the marker shape 602 as being associated with the polygon Net1 or Net2. Data types recognized by the DRC tool 162 are different for the polygon Net1 or Net2 and the marker shape 602. In other embodiments, the marker shape 602 are created using a layer different from but associated with that of the polygon Net1 or Net2.

For the in-phase nets, the DRC tool 162 applies the voltage-dependent design rule that involves corresponding-comparisons on the voltage indicators of the polygons. In some embodiment, the voltage-dependent design rule is provided to the DRC tool 162 in a script for the DRC tool 162. In some embodiments, the voltage-dependent design rule for in-phase nets to the DRC tool 162 determines a spacing $S_2$ of the polygons Net1 and Net2 based on an in-phase voltage difference calculated using equation (2).

$$\Delta V_{in\text{-}phase} = \max(|V_{max1} - V_{max2}|, |V_{min1} - V_{min2}|) \qquad (2)$$

where $\Delta V_{in\text{-}phase}$ is the in-phase voltage difference; $V_{max1}$ and $V_{min1}$ are the maximum voltage value and the minimum voltage value of one of the polygons such as Net2, respectively; and $V_{max2}$ and $V_{min2}$ are the maximum voltage value and the minimum voltage value of the other of the polygons such as Net1, respectively. In the example in FIG. 6A, $V_{max1}$ and $V_{min1}$ of the polygon Net2 are equal to 3.3V and 0V, respectively, and $V_{max2}$ and $V_{min2}$ of the polygon Net1 are equal to 3.3V and 1.5V, respectively. The in-phase voltage difference $\Delta V_{in\text{-}phase}$ used for determine the spacing $S_2$ between the nets Net1 and Net2 is 1.5V. In contrast, if the voltage-dependent design rule for out-of-phase nets is used to determine the spacing $S_2$, the out-of-phase voltage difference $\Delta V_{out\text{-}of\text{-}phase}$ is 3.3V. Therefore, the spacing $S_2$ determined using the in-phase voltage difference $\Delta V_{in\text{-}phase}$ is smaller than that determined using the out-of-phase voltage difference $\Delta V_{out\text{-}of\text{-}phase}$.

Figure 6B:
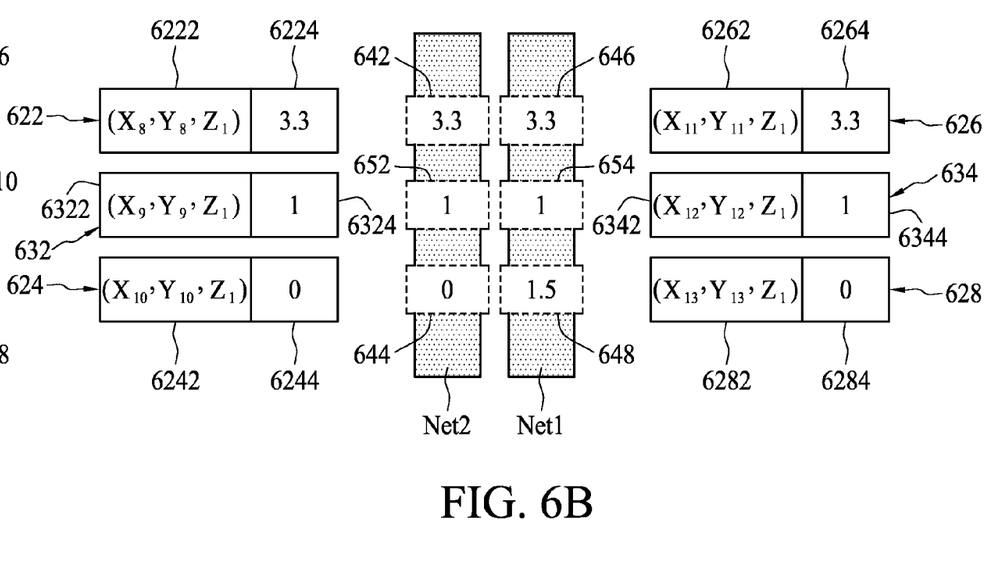
FIG. 6B is a diagram of some in-phase nets in the layout in FIG. 1 employing the text labels in accordance with some embodiments.

FIG. 6B is a diagram of some in-phase nets in the layout 152 in FIG. 1 employing the text labels as indicators in accordance with some embodiments. The embodiments described with reference to FIG. 6B are different from those described with reference to FIG. 6A in that the voltage indicators and the in-phase indicators are implemented using text labels 622, 632, 624, 626, 634 and 628. The voltage indicators implemented using the text labels 622, 624, 626 and 628 are similar to those in FIG. 5B. The text label 622, 624, 626 or 628 includes a location part 6222, 6242, 6262 or 6282 and a data part 6224, 6244, 6264 or 6284. The location part 6222, 6242, 6262 or 6282 includes coordinates $(X_8, Y_8, Z_1)$, $(X_{10}, Y_{10}, Z_1)$, $(X_{11}, Y_{11}, Z_1)$ or $(X_{13}, Y_{13}, Z_1)$ which reflect that the text label 622, 624, 626 or 628 is created at a corresponding location of a marker shape 642, 644, 646 or 648. The data part 6224 and 6244 include the maximum voltage value and the minimum voltage value of the net Net2, respectively, and the data part 6264 and 6284 include the maximum voltage value and the minimum voltage value of the net Net1, respectively. In addition to the voltage indicators, the in-phase indicators are created using the text labels 632 and 634. The text label 632 or 634 includes a location part 6322 or 6342, and a data part 6324 or 6344. The location part 6322 or 6342 includes coordinates $(X_9, Y_9, Z_1)$ or $(X_{12}, Y_{12}, Z_1)$ which reflect that the text label 632 or 634 is created at a corresponding location of a marker shape 652 or 654. The data part 6324 or 6344 includes a group identification. The polygons Net2 and Net1 labeled with the same group identification "1" are recognized as being in-phase. The marker shapes 642, 652, 644, 646, 654 and 648 are shown for illustration purpose and are not part of the text labels 622, 632, 624, 626, 634 and 628. In some embodiments, the coordinates $(X_8, Y_8, Z_1)$, $(X_9, Y_9, Z_1)$ and $(X_{10}, Y_{10}, Z_1)$ are determined based on coordinates $(X_7, Y_7, Z_1)$ in the location data of the polygon Net2, and the coordinates $(X_{11}, Y_{11}, Z_1)$ $(X_{12}, Y_{12}, Z_1)$ or $(X_{13}, Y_{13}, Z_1)$ are determined based on the coordinates $(X_1, Y_1, Z_1)$ in the location data of the polygon Net1. In some embodiments, the text labels 622, 632 and 624, or 626, 634 and 628 are in the same layer as the polygon Net2 or Net1. Data types of the polygon Net2 or Net1 and the text labels 622, 632 and 624, or 626, 634 and 628 are different. In other embodiments, the text labels 622, 632 and 624, or 626, 634 and 628 are created using a layer different from but associated with that of the polygon Net2 or Net1. The manner with which the spacing between the polygons Net2 and Net1 are determined is similar to that described with reference to FIG. 6A and is therefore omitted here.

Figure 7A:
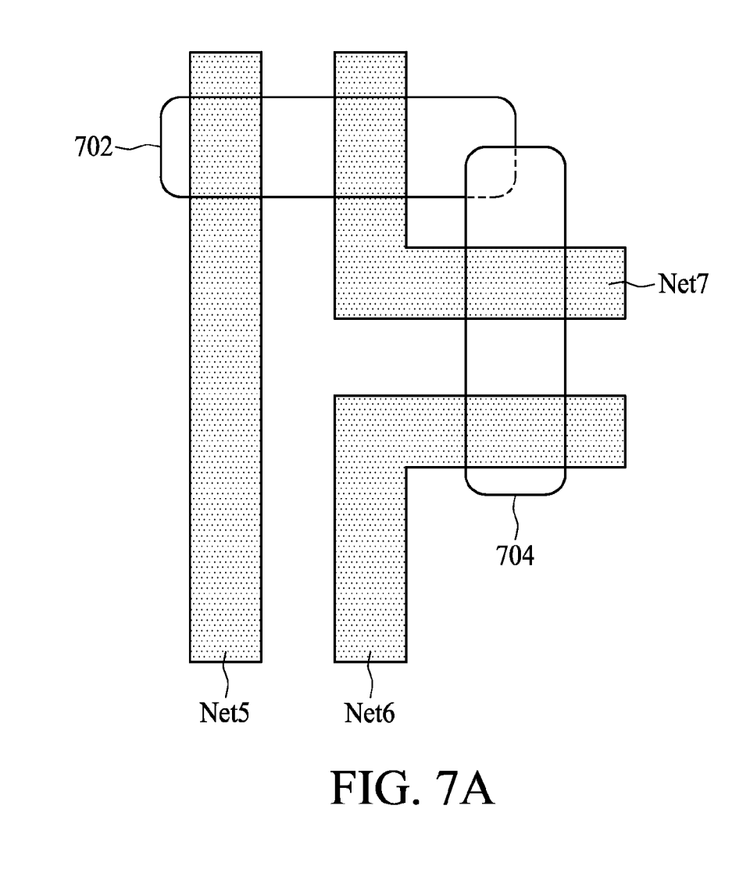
FIG. 7A is a diagram of some in-phase nets derived from other in-phase nets in the layout in FIG. 1 employing marker shapes as in-phase indicators in accordance with some embodiments.

FIG. 7A is a diagram of some in-phase nets derived from other in-phase nets in the layout 152 in FIG. 1 employing marker shapes as in-phase indicators in accordance with some embodiments. The layout 152 further includes polygons Net5, Net6 and Net7, and marker shapes 702 and 704. The polygons Net5 and Net7 are indicated as in-phase by the marker shape 702, and polygons Net6 and Net7 are indicated as in-phase by the marker shape 704. The polygons Net5 and Net6 are also adjacent. Because the polygons Net5 and Net7 are in-phase, and the polygons Net6 and Net7 are in-phase, the polygons Net5 and Net6 are derived to be in-phase. Therefore, the polygons Net5, Net6 and Net7 are in-phase. This mergence of in-phase groups is reflected by the marker shape 702 and the marker 704 that touch each other.

Figure 7B:
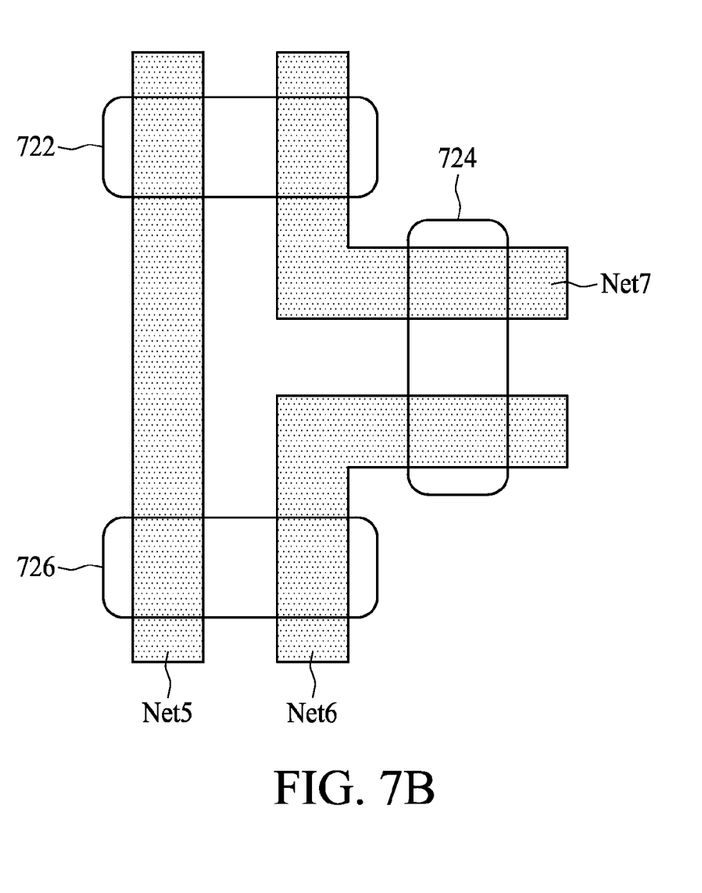
FIG. 7B is a diagram of some in-phase nets derived from other in-phase nets in the layout in FIG. 1 employing marker shapes as in-phase indicators in accordance with some other embodiments.

FIG. 7B is a diagram of some in-phase nets derived from other in-phase nets in the layout 152 employing marker shapes as in-phase indicators in accordance with some other embodiments. The embodiments described with reference to FIG. 7B are different from those described with reference to FIG. 7A in that the derived in-phase relationship between the polygons Net5 and Net6 is indicated by a new marker shape 726 overlapping with the polygons Net5 and Net6.

Figure 8A:
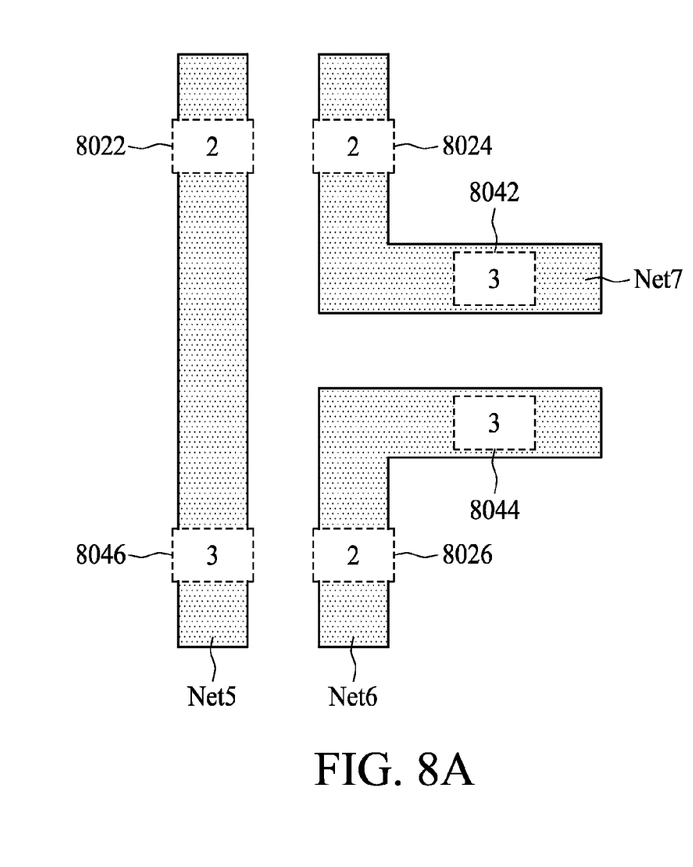
FIG. 8A is a diagram of some in-phase nets derived from other in-phase nets in the layout in FIG. 1 employing text labels as in-phase indicators in accordance with some embodiments.

FIG. 8A is a diagram of some in-phase nets derived from other in-phase nets in the layout 152 employing text labels as in-phase indicators in accordance with some embodiments. The layout 152 further includes the polygons Net5, Net6 and Net7, and text labels 8022, 8024, 8042 and 8044. In addition, the layout 152 further includes the text label 8026 and/or the text label 8046. The polygons Net5 and Net7 are indicated as in-phase by the text labels 8022 and 8024 with the same group identification "2", and the polygons Net6 and Net7 are indicated as in-phase by the text labels 8042 and 8044 with the same group identification "3". As a result, the polygons Net5, Net6, and Net7 are in-phase. The mergence of groups is reflected by introducing the additional text label 8046 with the group identification "3" to the polygon Net5, and/or the additional text label 8026 with the group identification "2" to the polygon Net6 to indicate that each of the nets Net5, Net6 and Net7 belong to the group with the group identification "3" and/or belong to the group with the group identification "2".

Figure 8B:
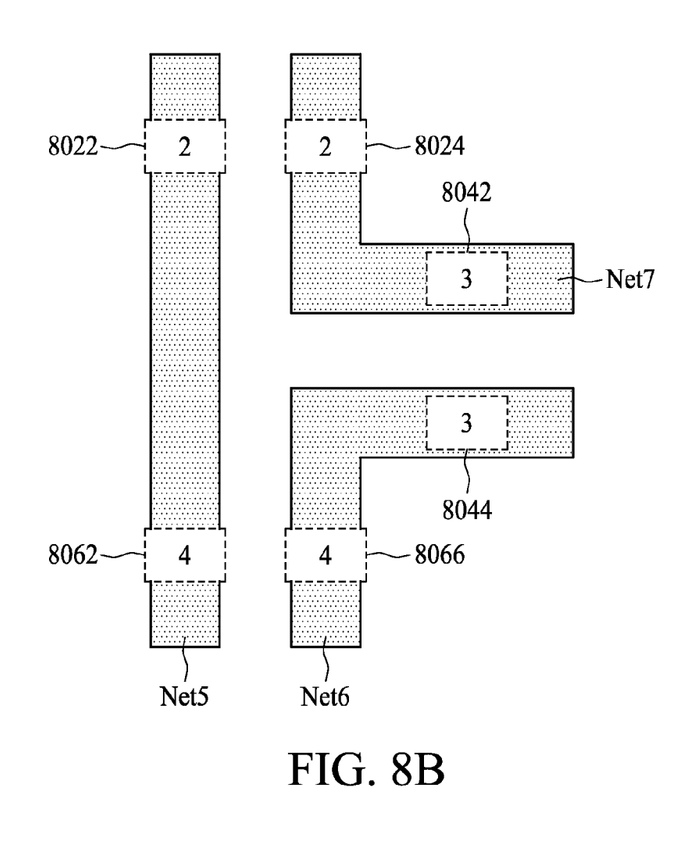
FIG. 8B is a diagram of some in-phase nets derived from other in-phase nets in the layout in FIG. 1 employing text labels as in-phase indicators in accordance with some other embodiments.

FIG. 8B is a diagram of some in-phase nets derived from other in-phase nets in the layout 152 employing text labels as in-phase indicators in accordance with some other embodiments. The embodiments described with reference to FIG. 8B are different from those described with reference to FIG. 8A in that the derived in-phase relationship between the polygons Net5 and Net6 is indicated by additional text labels 8062 and 8066 with a new group identification "4" attached to the polygons Net5 and Net6, respectively.

Figure 9:
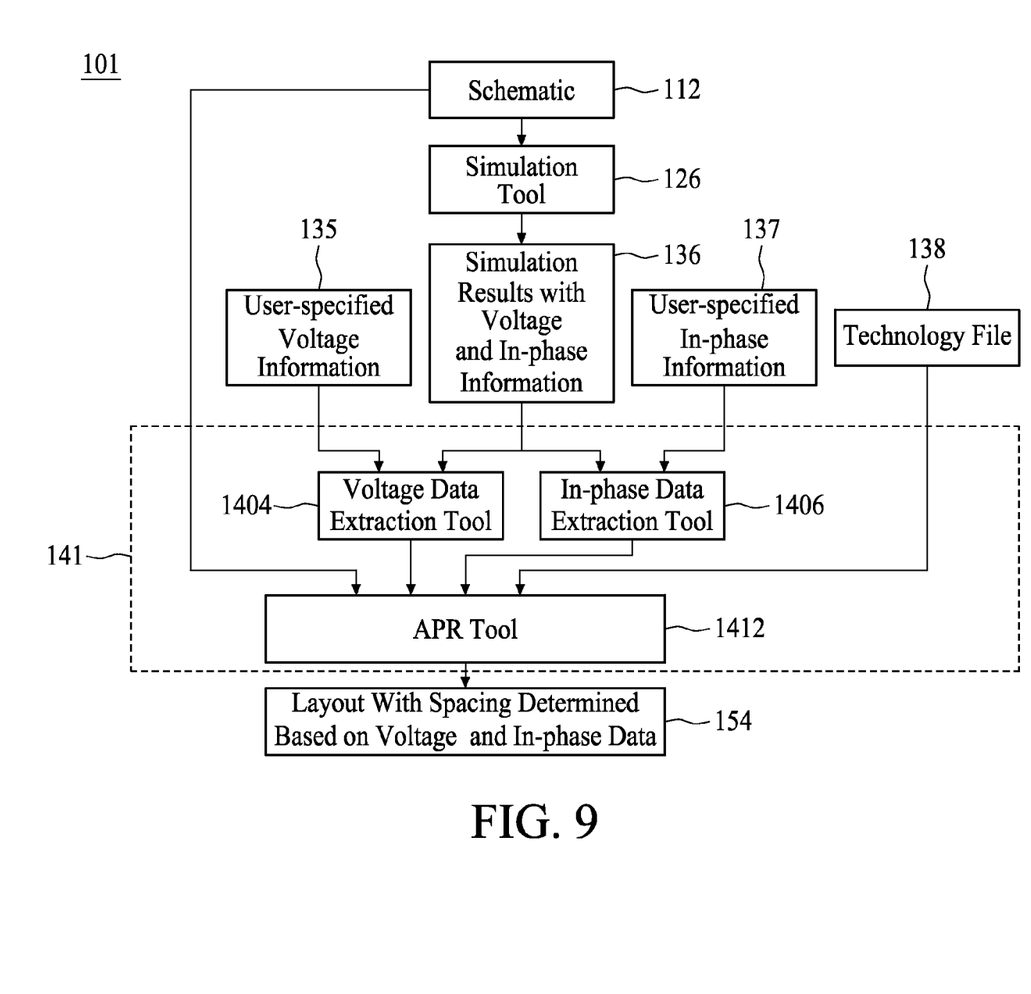
FIG. 9 is a block diagram of a semiconductor device design system in accordance with some embodiments.

FIG. 9 is a block diagram of a semiconductor device design system 101 in accordance with some embodiments. The system 101 is configured to generate a layout with spacing determined based on voltage and in-phase data 154. Some of the components of the system 101 are the same as those of the system 100 in FIG. 1 and are therefore omitted here. The system 101 includes a voltage-dependent layout processing tool 141 different from the voltage-dependent layout processing tool 140 of the system 100 in that the voltage-dependent layout processing tool 141 is configured to receive the schematic 112, the simulation results with voltage and in-phase information 136 and/or the user-specified voltage information 135 and the user-specified in-phase information 137, and the technology file 138, and generate the layout with spacing determined based on voltage and in-phase data 154. The voltage-dependent layout processing tool 141 includes the voltage data extraction tool 1404, the in-phase data extraction tool 1406, and an automatic place-and-route (APR) tool 1412. The voltage data extraction tool 1404 and the in-phase data extraction tool 1406 are similar to those of the voltage-dependent layout processing tool 140. The APR tool 1412 is configured to receive the schematic 112, the voltage data from the voltage data extraction tool 1404 and the in-phase data from the in-phase data extraction tool 1406 and generate the layout with spacing determined based on voltage and in-phase data 154. Similar to the embodiments described with reference to FIGS. 5A to 6B, each spacing of polygons associated with out-of-phase nets are determined based on cross-comparisons as shown in equation (1), and spacing of polygons associated with in-phase nets are determined based on corresponding-comparisons as shown in equation (2).

Figure 10:
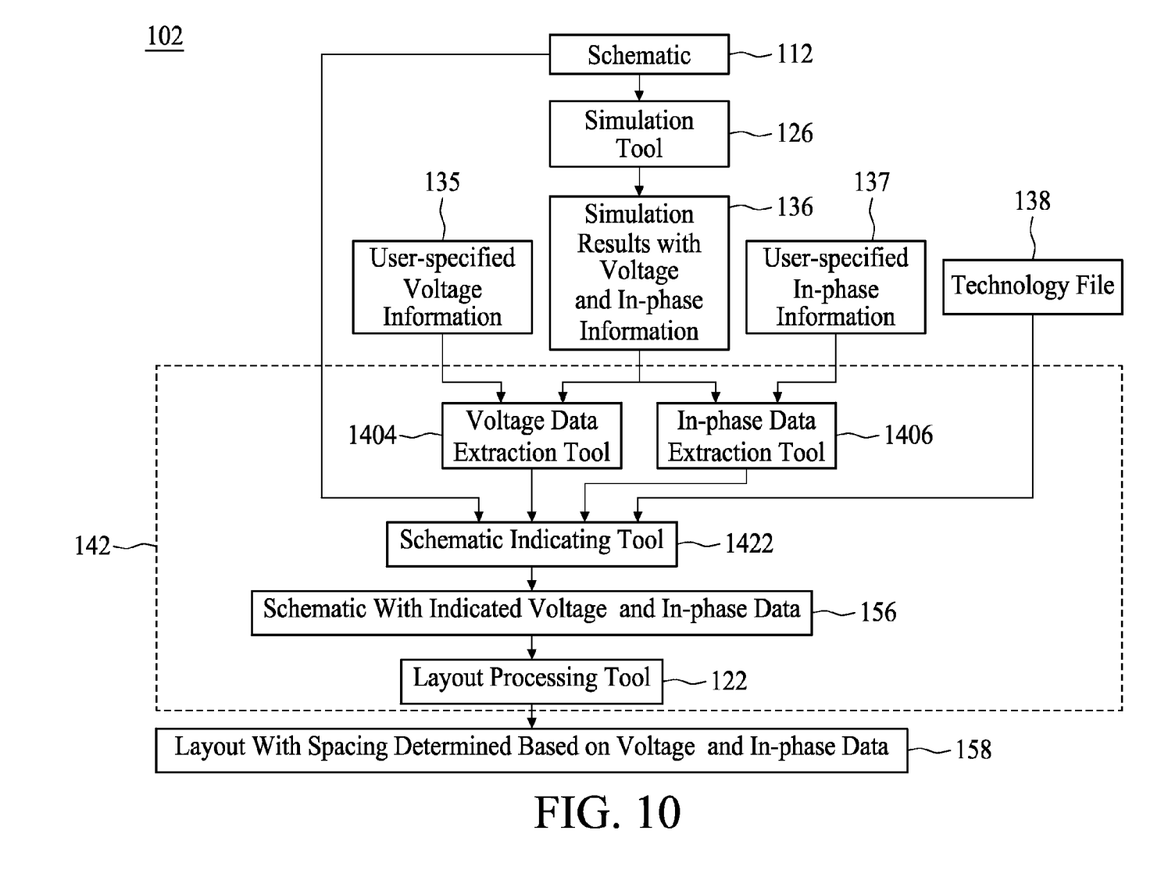
FIG. 10 is a block diagram of a semiconductor device design system in accordance with some embodiments.

FIG. 10 is a block diagram of a semiconductor device design system 102 in accordance with some embodiments. The system 102 is configured to generate a layout with spacing determined based on voltage and in-phase data 158 based on a schematic with indicated voltage and in-phase data 156. Some of the components of the system 102 are the same as those of the system 100 FIG. 1 and are therefore omitted here. The system 102 includes a voltage-dependent layout processing tool 142 different from the voltage-dependent layout processing tool 140 of the system 100 in that the voltage-dependent layout processing tool 142 is configured to receive the schematic 112, the simulation results with voltage and in-phase information 136 and/or the user-specified voltage information 135 and the user-specified in-phase information 137, and the technology file 138 and generate the layout with spacing determined based on voltage and in-phase data 158. The voltage-dependent layout processing tool 142 includes the voltage data extraction tool 1404, the in-phase data extraction tool 1406, a schematic indicating tool 1422 and a layout processing tool 122. The voltage data extraction tool 1404 and the in-phase data extraction tool 1406 are similar to those of the voltage-dependent layout processing tool 140. The schematic indicating tool 1422 is configured to receive the schematic 112, the voltage data from the voltage data extraction tool 1404 and the in-phase data from the in-phase data extraction tool 1406 and generate the schematic with indicated voltage and in-phase data 156. Based on the schematic with indicated voltage and in-phase data 156, a layout with spacing determined based on voltage and in-phase data 158 is manually generated using the layout processing tool 122.

Figure 11A:
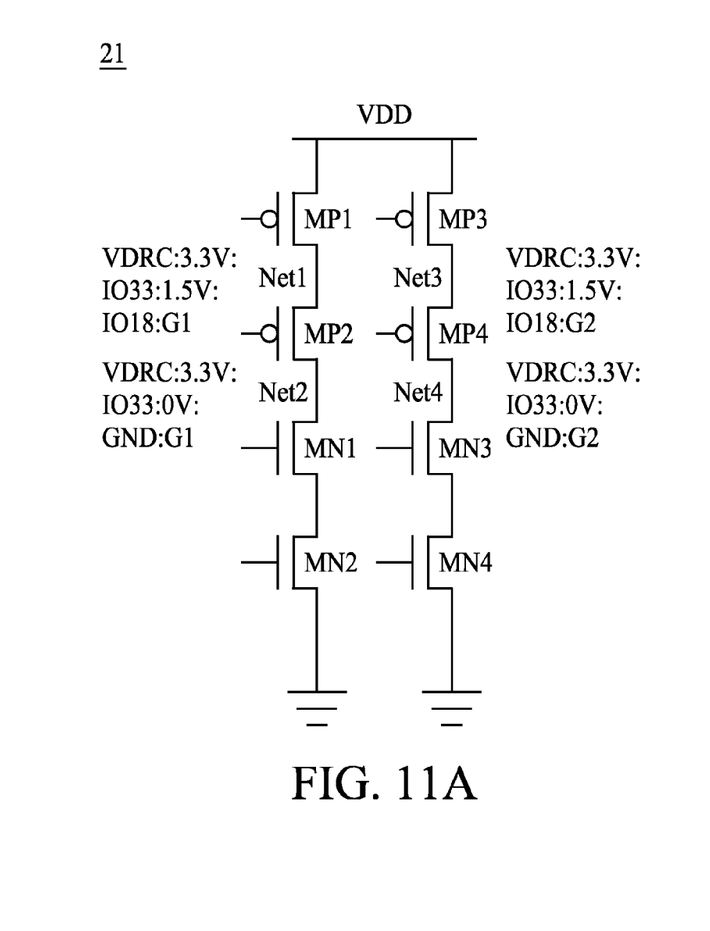
FIG. 11A is a diagram of a partial schematic of the schematic in FIG. 10 with voltage and in-phase indicators in accordance with some embodiments.

The schematic indicating tool 1442 is configured to generate the schematic with indicated voltage and in-phase data 156 based on the schematic 112, the voltage data and the in-phase data. FIG. 11A is a diagram of a partial schematic 21 of the schematic 156 in FIG. 10 with voltage and in-phase indicators in accordance with some embodiments. The partial schematic 21 is based on the partial schematic 20 in FIG. 2 and includes voltage and in-phase indicators for some nets in the partial schematic 20. In some embodiments, the voltage and in-phase indicators are implemented as a text label. For example, the text label for the net Net1 reads "VDRC:3.3V:IO33:1.5V:IO18:G1". The portion "VDRC" reflects the text label is configured for voltage-dependent design rules. The portion "3.3V:IO33" reflects that a maximum voltage value of the net Net1 is 3.3V and such voltage level corresponds to a category IO33. The portion "1.5V:IO18" reflects that a minimum voltage value of the net Net1 is 1.5V and such voltage level corresponds to a category IO18. Dividing different voltage values into categories reduces the number of different spacings between polygons in the generated layout 158 and therefore simplifies the manual layout process based on the schematic 156. In some embodiments, a list for mapping a voltage value to a corresponding category is provided in the technology file 138. The portion "G1" reflects that the net Net1 is in-phase with nets in a group "G1". Similarly, the text label for the net Net2 reads "VDRC:3.3V:IO33:0V:GND:G1". The text label for the net Net3 reads "VDRC:3.3V:IO33:1.5V:IO18:G2" The text label for the net Net3 reads "VDRC:3.3V:IO33:0V:GND:G2". Therefore, the nets Net1 and Net2 are indicated as in-phase. The nets Net3 and Net4 are indicated as in-phase. The nets Net1 and Net3 are out-of-phase. Based on the voltage indicators and in-phase indicators of the nets Net1 and Net2 in the schematic 156, a spacing $S_1$ of polygons Net1 and Net3 in the layout 158 is determined similarly to the spacing $S_1$ in FIG. 5A. Based on the voltage indicators and in-phase indicators of the nets Net1 and Net3 in the schematic 21, a spacing $S_2$ of the polygons Net1 and a polygon Net2 in the layout 158 is determined similarly to the spacing $S_2$ in FIG. 6A.

Figure 11B:
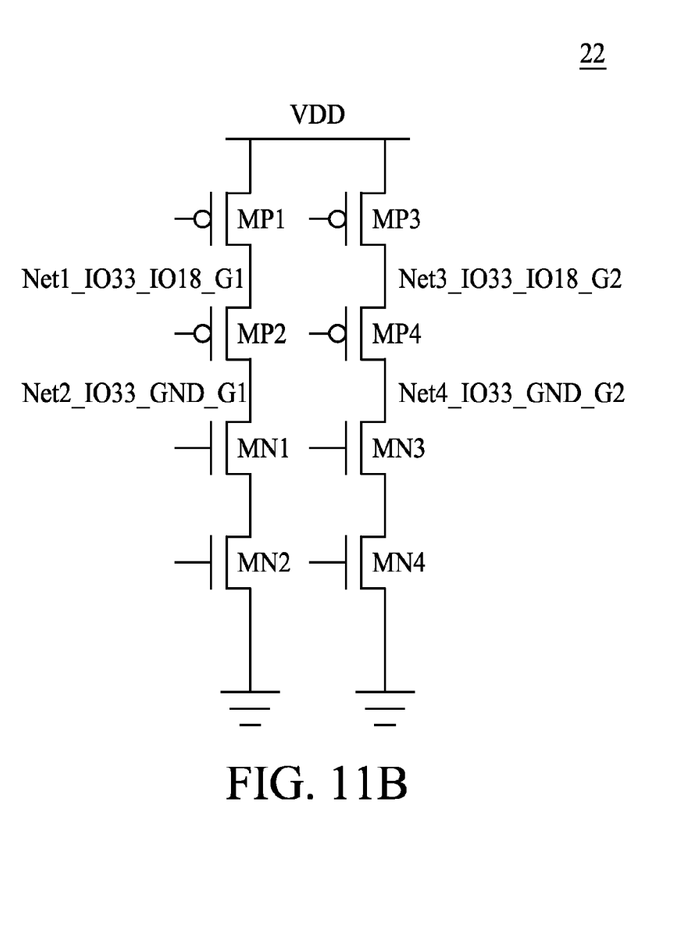
FIG. 11B is a diagram of a partial schematic of the schematic in FIG. 10 with voltage and in-phase indicators in accordance with other embodiments.

FIG. 11B is a diagram of a partial schematic 22 of the schematic 156 in FIG. 10 with voltage and in-phase indicators in accordance with other embodiments. The embodiments described with reference to FIG. 11B are different from the embodiments described with reference to FIG. 11A in that the voltage indicators and the in-phase indicators are included in net names. For example, the net "Net1" in the schematic 20 in FIG. 2 is renamed as "Net1_IO33_IO18_G1" to reflect that the net Net1 has a maximum voltage value in the IO33 category, a minimum voltage value in the IO18 category, and is in-phase with nets in the group "G1". Similarly, the net "Net2" is renamed as "Net2_IO33_GND_G1". The net "Net3" is renamed as "Net3_IO33_IO18_G2". The net "Net4" is renamed as "Net4_IO33_GND_G2".

In some embodiments, for some in-phase nets which are derived based on other in-phase nets as described with reference to FIG. 7A to 8B, text labels or net names for the derived in-phase nets are modified to indicate an existing group identification of the other in-phase nets or indicate a new group identification for the derived in-phase nets.

The partial schematics 21 and 22 are exemplary. Other ways to represent voltage indicators and in-phase indicators such as using graphical-based indicators instead of text-based indicators are within the contemplated scope of the present disclosure.

Figure 12:
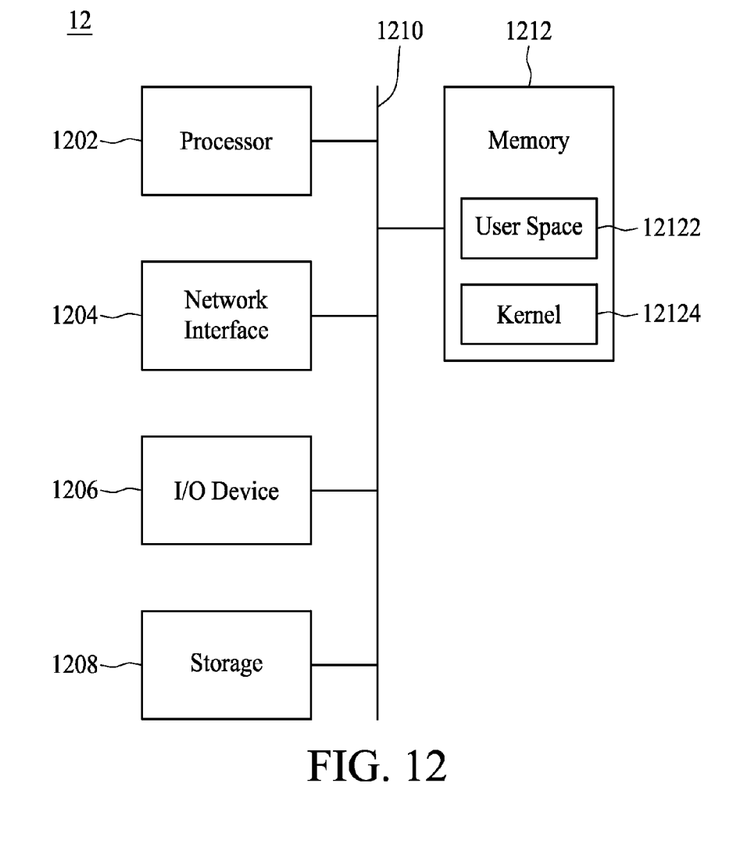
FIG. 12 is a block diagram of a system for implementing the voltage-dependent layout processing system in FIG. 1, 9, or 10 in software in accordance with some embodiments.

FIG. 12 is a block diagram of a system 12 for implementing the voltage-dependent layout processing system 140, 141 in FIG. 1, FIG. 9 or FIG. 10 in software in accordance with some embodiments. The system 12 includes at least one processor 1202, a network interface 1204, an input and output (I/O) device 1206, a storage 1208, a memory 1212, and a bus 1210. The bus 1210 couples the network interface 1204, the I/O device 1306, the storage 1208 and the memory 1212 to the processor 1202.

In some embodiments, the memory 1212 comprises a random access memory (RAM) and/or some other volatile storage device and/or read only memory (ROM) and/or some other non-volatile storage device. The memory 1212 includes a kernel 12124 and user space 12122, configured to store program instructions to be executed by the processor 1202 and data accessed by the program instructions.

In some embodiments, the network interface 1204 is configured to access program instructions and data accessed by the program instructions stored remotely through a network (not shown). The I/O device 1206 includes an input device and an output device configured for enabling user interaction with the system 12. The input device comprises, for example, a keyboard, a mouse, etc. The output device comprises, for example, a display, a printer, etc. The storage device 1208 is configured for storing program instructions and data accessed by the program instructions. The storage device 1308 comprises, for example, a magnetic disk and an optical disk.

In some embodiments, when executing the program instructions, the processor 1202 is configured as any of the tool 140, 141, and 142 described with references to FIG. 1, 9 or 10. In some embodiments, other tools in the system 100, 101 or 102 are also implemented in software.

In some embodiments, the program instructions are stored in a non-transitory computer readable recording medium such as one or more optical disks, hard disks and non-volatile memory devices.

In some embodiments, in a method, for a first net and a second net in a schematic, first data for obtaining the differences between first voltage values of the first and second nets, and between second voltage values of the first and second nets for a design rule is provided. A layout for the schematic is generated. In the layout, a relationship of a first shape and a second shape associated with the first and the second nets, respectively, is defined using the first data.

In some embodiments, a system includes at least one processor configured to execute program instructions and at least one memory configured to store the program instructions. The program instructions include a tool configured to, for a first net and a second net in a schematic, provide first data for obtaining the larger of differences between first voltage values the first and second nets, and between second voltage values of the first and second nets for a design rule, and generate a layout for the schematic in which a relationship of a first shape and a second shape associated with the first and the second nets, respectively, is defined using the first data. For each of the first and second nets, the first voltage value is larger than the second voltage value.

The above description includes exemplary operations, but these operations are not necessarily required to be performed in the order shown. Operations may be added, replaced, changed order, and/or eliminated as appropriate, in accordance with the spirit and scope of the disclosure. Accordingly, the scope of the disclosure should be determined with reference to the following claims, along with the full scope of equivalences to which such claims are entitled.

What is claimed is:

1. A method, comprising:
   providing, by at least one processor, a first voltage value and a second voltage value in a simulation result of a first net of a schematic;
   providing, by the at least one processor, a first voltage value and a second voltage value in a simulation result of a second net of the schematic;
   providing, by the at least one processor, first in-phase data reflecting the first voltage values occur correspondingly in simulation results of the first net and the second net, and the second voltage values occur correspondingly in the simulation results of the first net and the second net; and
   generating a layout for the schematic in which a relationship of a first shape and a second shape associated with the first net and the second net, respectively, is defined using the in-phase data.

2. The method according to claim 1, wherein generating a layout for the schematic comprises:
   receiving an original layout with the first and second shapes; and
   indicating, in the original layout, the relationship of the first and second shapes using the first in-phase data to generate the layout.

3. The method according to claim 2, wherein indicating, in the original layout, the relationship of the first and second shapes using the first in-phase data to generate the layout comprises:
   introducing a first marker shape overlapping with the first and second shapes in the layout.

4. The method according to claim 2, wherein indicating, in the original layout, the relationship of the first and second shapes using the first in-phase data to generate the layout comprises:
   labeling, the first and second shapes with the same first group identification in the layout.

5. The method according to claim 2, further comprising:
   providing a design rule for performing design rule checking on the first and second shapes based on calculating the differences between the first voltage values of the first and second nets, and between the second voltage values of the first and second nets.

6. The method according to claim 1, wherein generating a layout for the schematic comprises:
   generating the layout in which a spacing between the first and second shapes is determined based on the first in-phase data.

7. The method according to claim 6, further comprising:
modifying the schematic to indicate the relationship of the first and second shapes associated with the first and second nets using the first in-phase data for generating the layout.

8. The method according to claim 1, further comprising:
providing a first voltage value and a second voltage value in a simulation result of a third net of the schematic; and
providing second in-phase data reflecting the first voltage values occur correspondingly in simulation results of the second net and the third net, and the second voltage values occur correspondingly in the simulation results of the second net and the third net;
the layout being generated such that
a relationship of the second shape and a third shape associated with the third net is defined based on the second in-phase data, and
a relationship of the first shape and the third shape is defined based on the first in-phase data and the second in-phase data.

9. The method according to claim 8, wherein generating a layout for the schematic comprises:
introducing a second marker shape overlapping with the second and third shapes in the layout; and
introducing a third marker shape overlapping with the first and third shapes in the layout.

10. The method according to claim 8, wherein generating a layout for the schematic comprises:
introducing a second marker shape overlapping with the second and third shapes in the layout, the first shape overlapping with the second shape.

11. The method according to claim 8, wherein generating a layout for the schematic comprises:
labeling the second and third shapes with the same second group identification in the layout; and
labeling the first and third shapes with the same third group identification in the layout.

12. The method according to claim 8, wherein generating a layout for the schematic comprises:
labeling the second and third shapes with the same second group identification in the layout; and
labeling the third shape with the first group identification in the layout or labeling the first shape with the second group identification in the layout.

13. A system, comprising:
at least one processor configured to execute program instructions including:
a voltage data extraction tool configured to:
provide a first voltage value and a second voltage value in a simulation result of a first net of a schematic; and
provide a first voltage value and a second voltage value in a simulation result of the second net of the schematic;
an in-phase data extraction tool configured to provide first in-phase data reflecting the first voltage values occur correspondingly in the simulation results of the first net and the second net, and the second voltage values occurs correspondingly in the simulation results of the first net and the second net; and
a layout-generating tool configured to generate a layout for the schematic in which a relationship of a first shape and a second shape associated with the first net and the second net, respectively, is defined using the first in-phase data; and
at least one memory configured to store the program instructions.

14. The system according to claim 13, wherein the layout-generating tool comprises:
a layout indicating tool configured to:
receive an original layout with the first and second shapes; and
indicate, in the original layout, the relationship of the first and second shapes using the first in-phase data to generate the layout.

15. The system according to claim 14, wherein the layout indicating tool is configured to indicate, in the original layout, the relationship of the first and second shapes using the first data to generate the layout by:
introducing a first marker shape overlapping with the first and second shapes in the layout.

16. The system according to claim 14, wherein the layout indicating tool is configured to indicate, in the original layout, the relationship of the first and second shapes using the first in-phase data to generate the layout by:
labeling, the first and second shapes with the same first group identification in the layout.

17. The system according to claim 13, wherein the layout-generating tool comprises:
an automatic place-and-route tool configured to generate the layout in which a spacing between the first and second shapes is determined based on the first in-phase data.

18. The system according to claim 13, wherein the layout-generating tool comprises:
a schematic indicating tool configured to modify the schematic to indicate the relationship of the first and second shapes associated with the first and second nets; and
a layout processing tool configured to use the modified schematic to generate the layout in which a spacing between the first and second shapes is determined based on the first in-phase data.

* * * * *